US012801035B2

(12) United States Patent
Roset

(10) Patent No.: US 12,801,035 B2
(45) Date of Patent: Nov. 17, 2026

(54) LITHOGRAPHIC APPARATUS CONTROLLER SYSTEM

(71) Applicant: ASML Netherlands B.V., Veldhoven (NL)

(72) Inventor: Bas Johannes Petrus Roset, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 161 days.

(21) Appl. No.: 18/834,882

(22) PCT Filed: Feb. 3, 2023

(86) PCT No.: PCT/EP2023/052670

§ 371 (c)(1),
(2) Date: Jul. 31, 2024

(87) PCT Pub. No.: WO2023/148326

PCT Pub. Date: Aug. 10, 2023

(65) Prior Publication Data

US 2025/0116944 A1 Apr. 10, 2025

(30) Foreign Application Priority Data

Feb. 4, 2022 (EP) .................................... 22155251

(51) Int. Cl.
*G03F 7/00* (2006.01)
*G05B 11/42* (2006.01)

(52) U.S. Cl.
CPC ...... *G03F 7/70725* (2013.01); *G03F 7/70775* (2013.01); *G05B 11/42* (2013.01)

(58) Field of Classification Search
CPC . G03F 7/70725; G03F 7/70775; G05B 11/42; G05B 2219/41186;

(Continued)

(56) References Cited

U.S. PATENT DOCUMENTS 4,893,068 A * 1/1990 Evans, Jr. ............ G05B 19/232 318/610
5,602,689 A * 2/1997 Kadlec .................. G11B 21/10 360/78.04

(Continued)

FOREIGN PATENT DOCUMENTS

WO WO 2018/215153 A1 11/2018

OTHER PUBLICATIONS

International Search Report and Written Opinion of the International Searching Authority directed to International Patent Application No. PCT/EP2023/052670, mailed Apr. 26, 2023; 10 pages.

(Continued)

*Primary Examiner* — Ziaul Karim
(74) *Attorney, Agent, or Firm* — FINNEGAN, HENDERSON, FARABOW, GARRETT & DUNNER, LLP

(57) ABSTRACT

A controller system is configured to control a plant and comprising a feedforward controller to provide, based on a reference state signal, a feedforward signal to the plant, and a feedback controller system to provide a feedback signal to the plant, based on a difference between the reference state signal and a plant state signal representing an actual state of the plant. The feedback controller system comprises an integrator, a trajectory generator, and a selector. The feedback controller system is configured to operate as a function of the reference state in a first control mode or a second control mode, wherein the feedback controller system, in the first control mode, operates the selector to select the trajectory generator output signal generated by the trajectory generator, and wherein the feedback controller system, in the second control mode, operates the selector to select the integrator output signal generated by the integrator.

16 Claims, 7 Drawing Sheets

(58) Field of Classification Search
CPC ........... G05B 2219/42065; G05B 2219/42116; G05B 2219/42124; G05B 2219/45028; G05B 19/19
See application file for complete search history.

(56) References Cited

U.S. PATENT DOCUMENTS

| | | | | |
|---|---|---|---|---|
| 6,020,964 | A | 2/2000 | Loopstra et al. | |
| 6,091,215 | A * | 7/2000 | Lovett | B23K 20/121 318/128 |
| 6,952,253 | B2 | 10/2005 | Lof et al. | |
| 10,890,905 | B1 * | 1/2021 | Sepe, Jr. | B64D 31/00 |
| 2002/0017883 | A1 * | 2/2002 | Marcinkiewicz | H02P 25/032 318/400.01 |
| 2007/0058173 | A1 | 3/2007 | Holzapfel | |
| 2013/0307447 | A1 * | 11/2013 | Rozman | G05B 11/01 318/400.02 |
| 2018/0164701 | A1 | 6/2018 | De Best et al. | |
| 2018/0217573 | A1 * | 8/2018 | Nitsche | G05B 19/19 |
| 2021/0088914 | A1 | 3/2021 | Nishimura et al. | |

OTHER PUBLICATIONS

Heertjes et al., “Self-tuning in integral sliding mode control with a Levenberg-Marquardt algorithm,” Mechatronics, vol. 24, No. 4, Jun. 2014; pp. 385-393.

Hunnekens et al., “Synthesis of variable gain integral controllers for linear motion Systems,” IEEE Transactions on Control Systems Technology, vol. 23, No. 1, Jan. 2015; pp. 139-149.

Wikipedia, “Bode’s sensitivity integral,” retrieved on Aug. 13, 2024 from: https://en.wikipedia.org/wiki/Bode%27s_sensitivity_integral; 2 pages.

Khalil, Hassan K., “Nonlinear Systems,” Third Edition, Prentice Hall, Dec. 18, 2001; 384 pages.

* cited by examiner

LITHOGRAPHIC APPARATUS CONTROLLER SYSTEM

FIELD

The present invention relates to a controller system, a stage comprising such a controller system and a lithographic apparatus comprising such a controller system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

The lithographic apparatus may perform repetitive movements when projecting the pattern onto the substrate, e.g. making scanning movements to scan a part of the substrate. In between the scanning movements, accelerations and decelerations may be performed to change a velocity of movement or a direction of the movement. The movements, such as the movements of a stage of the lithographic apparatus may be controlled by a controller. The controller may for example implement a proportional, integrator and differentiator control.

SUMMARY

Considering the above, it is an object of the invention to provide a lithographic apparatus having a high throughput.

According to an embodiment of the invention, there is provided a controller system configured to control a plant, comprising:

- a feedforward controller configured to provide, based on a reference state signal, a feedforward signal to the plant, and
- a feedback controller system configured to provide a feedback signal to the plant, based on a difference between the reference state signal and a plant state signal representing an actual state of the plant,
- wherein the feedback controller system comprises an integrator, a trajectory generator, and a selector configured to selectively output into the feedback signal to the plant one of a trajectory generator output signal generated by the trajectory generator and an integrator output signal generated by the integrator,
- wherein the feedback controller system is configured to operate as a function of the reference state signal in a first control mode or a second control mode wherein the feedback controller system is configured to, in the first control mode, operate the selector to select the trajectory generator output signal generated by the trajectory generator, and
- wherein the feedback controller system is configured to, in the second control mode, operate the selector to select the integrator output signal generated by the integrator.

According to a further embodiment of the invention, there is provided a stage comprising the controller system according to the invention, configured to control a position of the stage, the reference state signal being a position setpoint of the stage.

According to a yet further embodiment of the invention, there is provided a lithographic apparatus comprising the controller system according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
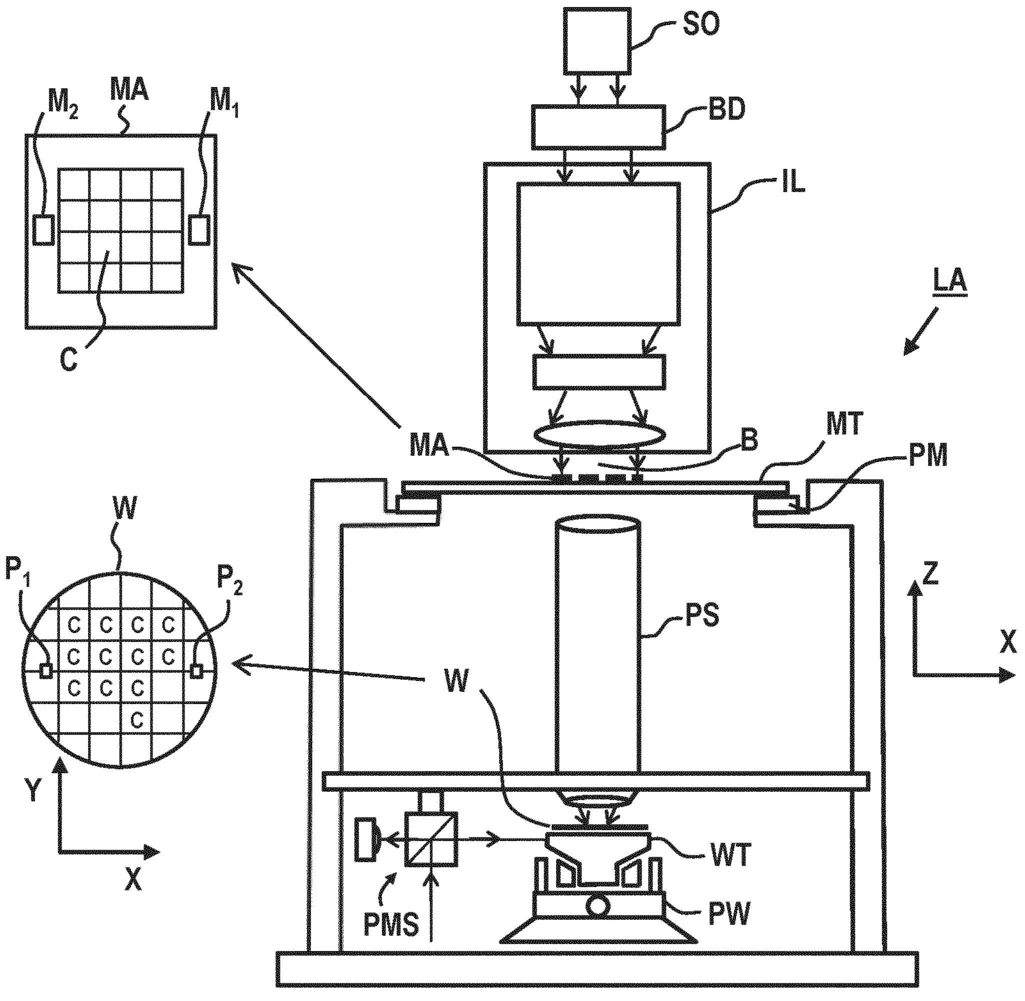
FIG. 1 depicts a schematic overview of a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
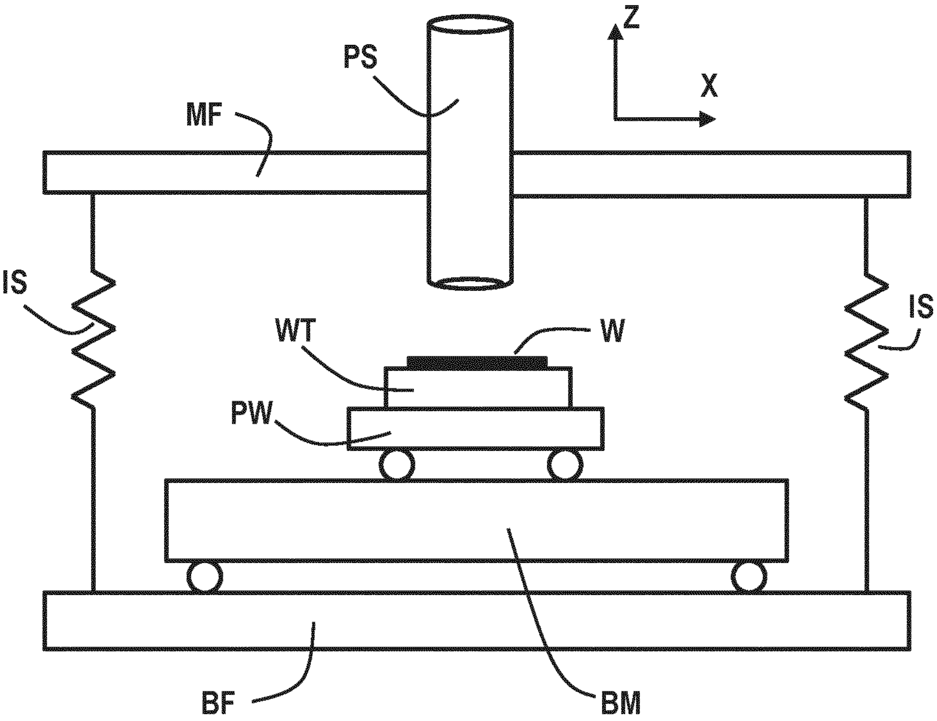
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads is arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
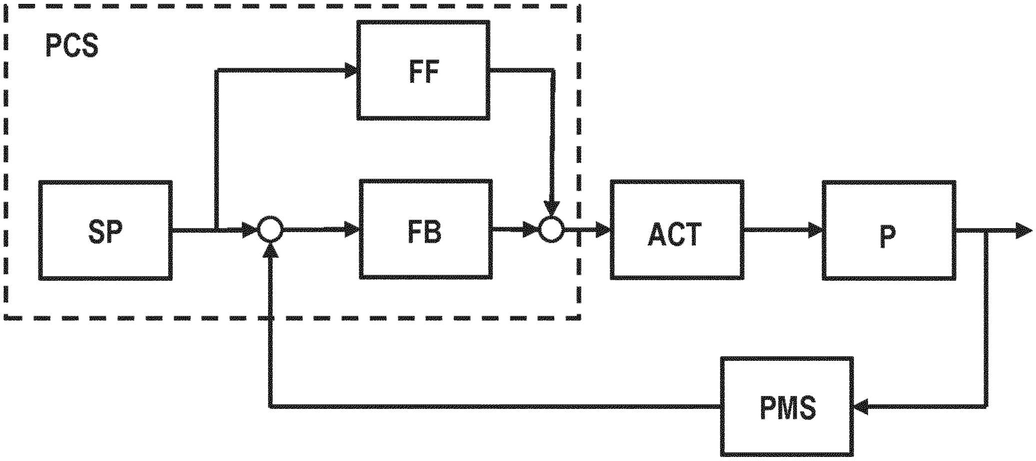
FIG. 3 schematically depicts a position control system as part of a positioning system as may be employed in an embodiment of the invention.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
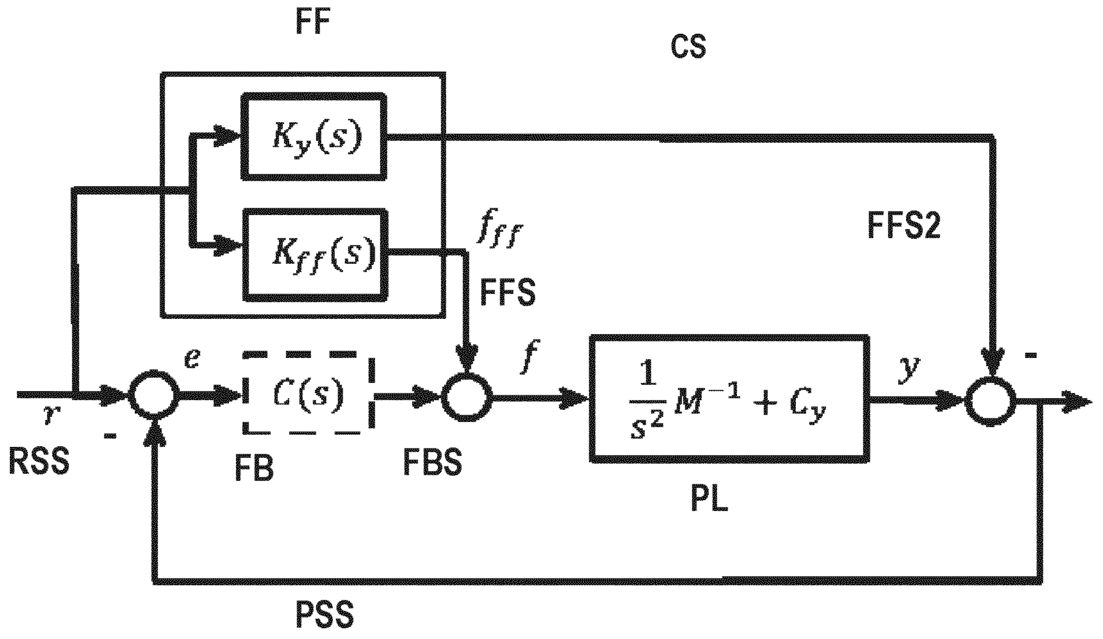
FIG. 4 depicts a controller system.

FIG. 4 depicts a block schematic view of a controller system CS. The controller system is configured to control a plant PL. The plant PL may be formed by any plant to be controlled, such as any actuator, system, subsystem, process, etc. For example, the plant may be formed by a movable object, such as a stage, e.g. a substrate stage or a reticle stage, or any other positioning device. Correspondingly, the reference state signal may be formed by a position signal representative of a desired position of the movable object.

The controller system CS comprises a feedback controller system FB which generates a feedback signal FBS and a feedforward controller FF which generates a feedforward signal FFS. The feedforward signal and feedback signal are added and provided as input to the plant PL. For example, in the case of a stage, the feedforward and feedback signals may be actuator drive signals that drive a positioning actuator of the stage. The generic term "plant" associated with FIG. 4 may thus be understood as to comprise the actuator ACT as referred to in relation to FIG. 3. The feedback controller system FB operates in a feedback loop configuration, whereby a feedback signal is derived from the output of the plant, i.e. the plant state signal PSS. The plant state signal is deducted from a setpoint signal, i.e. reference state signal RSS which represents a desired state of the plant. The difference between the reference state signal and the plant state signal, i.e. error signal e, is provided as input to the feedback controller system. The feedforward controller provides, using the reference state signal as input, a feedforward signal FFS to the plant. The combination of feedforward and feedback enables to address dynamic behavior and accuracy.

It is noted that the depicted control system may further provide a second feedforward signal FFS2 to the output of the plant. The output of the plant may thereby be corrected for e.g. non-ideal behavior in response to the feedforward signal. For example, in case the plant is formed by a stage, a finite stiffness of the stage, resulting in deformation in response to the feedforward signal, may at least partly be corrected by the second feedforward signal FFS2.

The feedback controller system may comprise a PID controller, comprising a proportional gain (P), an integrator (I) and a differentiator (D).

The lithographic apparatus may perform repetitive movements when projecting the pattern onto the substrate, e.g. making scanning movements to scan a part of the substrate. The scanning movement may be performed at a constant stage velocity. In between the scanning movements, accelerations and decelerations may be performed to change e.g. a direction of the movement.

Figure 5:
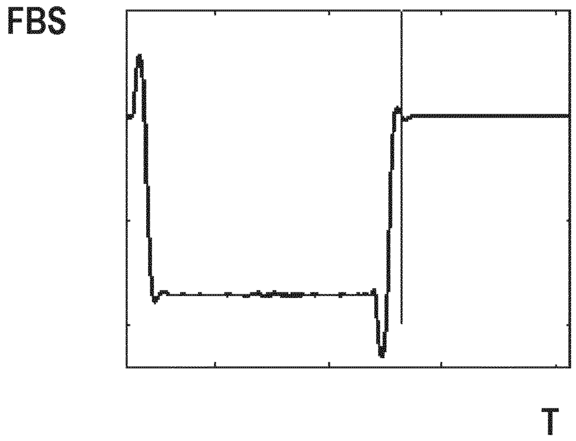
FIG. 5 depicts a time diagram illustrating a time response resulting from the controller system in accordance with FIG. 4.

FIG. 5 depicts a graphical view of a output signal of the integrator in response to a change in acceleration, versus time T. As shown in FIG. 5, upon a change in acceleration, the integrator tends to provide for an overshoot in opposite direction.

Figure 6:
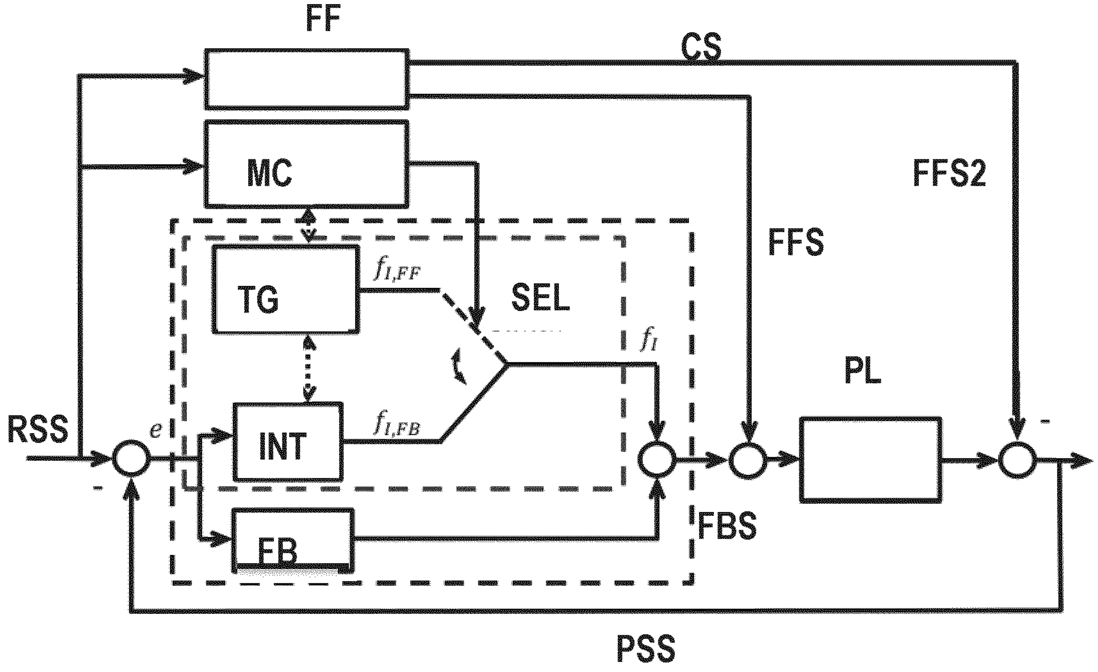
FIG. 6 depicts a controller system according to an embodiment.

FIG. 6 depicts a block schematic view of a controller system CS according to an embodiment.

Likewise to the controller system described with reference to FIG. 4, the controller system CS as depicted in FIG. 6 comprises a feedback controller system FB which generates a feedback signal FBS and a feedforward controller FF which generates a feedforward signal FFS. The feedback controller system FBS comprises a feedback controller FB. The feedforward signal and feedback signal are added and provided as input to the plant PL. For example, in the case of a stage, the feedforward and feedback signals may be actuator drive signals that drive a positioning actuator of the stage. A feedback controller system FBS operates in a feedback loop configuration, whereby a feedback signal is derived from the output of the plant, i.e. the plant state signal PSS. The plant state signal is deducted from a setpoint signal, i.e. reference state signal RSS which represents a desired state of the plant. The difference between the reference state signal and the plant state signal, i.e. error signal e, is provided as input to the feedback controller system. The feedforward controller provides, using the reference state signal as input, a feedforward signal FFS to the plant. The combination of feedforward and feedback enables to address dynamic behavior and accuracy.

Likewise to the controller system described with reference to FIG. 4, the depicted controller system further provides a second feedforward signal FFS2 to the output of the plant. The output of the plant may thereby be corrected for e.g. non-ideal behavior in response to the feedforward signal. For example, in case the plant is formed by a stage, a finite stiffness of the stage, resulting in deformation in response to the feedforward signal, may at least partly be corrected by the second feedforward signal FFS2.

The feedback controller system FBS as depicted in FIG. 6 comprises the feedback controller FB and an integrator INT. The feedback controller system further comprises a trajectory generator TG to generate a trajectory, the trajectory may be formed by a time sequence of trajectory generator output values. Still further, the feedback controller system comprises a selector. The selector comprises dual selector inputs, one of the selector inputs is connected to the output of the trajectory generator while the other one of the selector inputs is connected to the output of the integrator INT of the feedback controller system. The trajectory generator may generate any suitable trajectory generator output signal, e.g. a desired response as would be desired from the integrator, examples of which will be explained in more detail below. Accordingly, the selector selects one of these inputs to be output at a selector output of the selector. The selector output accordingly outputs the output of the integrator or the output of the trajectory generator. The feedback controller further comprises a mode controller MC which operates the selector as a function of the reference state signal, the reference state signal being input to the mode controller. As a function of the reference state signal, the feedback controller system operates in a first control mode or in a second control mode. In the first control mode, the feedback controller system operates the selector to select the trajectory generator output signal generated by the trajectory generator while omitting (discarding) the integrator output signal. Thus, in the first control mode, the feedback controller system adds the trajectory generator output signal to the feedback controller output signal. In the second control mode, the feedback controller system operates the selector to select the integrator output signal generated by the integrator. Thus, in the second control mode, the feedback controller system adds the integrator output signal to the feedback controller output signal while omitting (discarding) the trajectory generator output signal. The selector is controlled by the mode controller to operate in the first or second control mode as a function of the reference state signal.

The feedback controller system is configured to, by means of the selector, replace the integrator output signal by the trajectory generator output signal. The feedback controller system performs the selection as a function of the reference state signal. The function may be any suitable function. For example, the function may comprise a threshold, a single, double or triple time differentiator to derive a time derivative, second time derivative or third time derivative of the reference state signal. Any other suitable functions exhibiting physical knowledge of the type of disturbances acting on the plant, may be employed.

Thus, depending on the reference state signal, e.g. depending on a change thereof over time, the selector may be operated to replace the integrator output signal $f_{I,FB}$ by the trajectory generator output signal $f_{I,FF}$. As a result, in a circumstance where the integrator may be e.g. lagging behind, delay or otherwise adversely affect a fast and accurate response, the integrator output signal may be replaced by the trajectory output signal.

In an embodiment, the trajectory is representative of a second time derivative of the reference state signal. For example, in case the reference state signal is a position, the second time derivative of the reference state signal is the acceleration. Accordingly, as the acceleration exhibits a relatively fast change (in absolute terms), e.g. when transitioning from an acceleration of the stage to a constant velocity movement, the trajectory may be derived from the reference state signal as generated by the reference state signal generator. The scaling may be implemented to provide that a beginning value of the trajectory matches an actual value of the integrator output at the moment of transitioning into the first mode while the end value of the trajectory matches an expected value of the integrator output when the constant velocity has been reached. As the second time derivative of the reference state signal may represent a dynamic situation in which the (relatively slow) integrator may adversely affect a performance of the controller system, the controller system output may be replaced by the trajectory generator output in this situation, whereby an advantageous trajectory may be derived from the second time derivative of the reference state signal.

Figure 7:
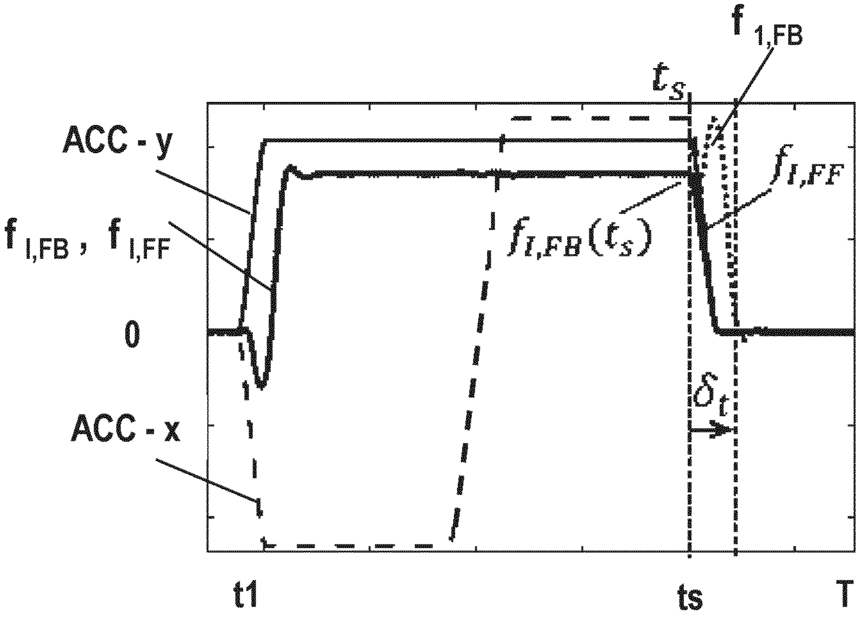
FIG. 7 depicts a time diagram illustrating a time response resulting from the controller system in accordance with FIG. 6.

An example of the trajectory is depicted in FIG. 7. FIG. 7 depicts an acceleration signal versus time, i.e. depicts a second time derivative of the stage position versus time. Initially, the acceleration of the stage is zero, thus the stage is e.g. moving at a constant velocity. Then at the time t1, an acceleration of the stage raises in y direction, ACC-y from 0 towards a constant level, causing a velocity of the stage to change. For example the velocity of the stage changes from V towards zero followed by a change towards −V, i.e. moving in an opposite direction. As of time ts, the acceleration reduces towards zero. When reaching zero, the stage moves at the constant velocity−V, i.e. in the opposite Y direction. A following scanning movement at a constant scanning velocity may begin. FIG. 7 likewise depicts an acceleration of the stage in x direction, ACC-x. FIG. 7 further depicts closed-loop integrator system response signals during the acceleration phase before the expose scanning phase. The response $f_{I,FB}$ represents a response of an integrator system according to the prior art. As of time t1, the integrator response to the change in acceleration, initially with an integrator signal in opposite direction, as represented by the "undershooting" in FIG. 7. After such damped ringing phenomena having damped, a constant integrator output signal is provided, in accordance with the constant change in acceleration. Then, at time ts, as the acceleration reduces towards zero, the change in acceleration correspondingly results in a change in the integrator output signal, likewise showing damped ringing, resulting in a response which initially tends in the opposite direction. After a stabilization time, the integrator output signal returns towards zero and the scanning movement at constant velocity may begin. The response $f_{I,FF}$ represents the proposed integrator system comprising the first and second control mode.

In an embodiment, before the switching time $t_s$, the controller system is in the second control mode, whereby the selector outputs the integrator output signal $f_{I,FB}$. As depicted in FIG. 7, as of time $t_1$, the integrator output signal tends towards an opposite direction, i.e. tends to provide some extent of damped ringing, resulting in e.g. an "overshooting" in reverse direction, as may be identified by "undershooting". At time $t_s$, the controller system switches from the second control mode to the first control mode, i.e. transitions from the selector outputting the integrator output signal to the selector outputting the trajectory generator output signal. In case the selector would not have switched to the first control mode, the integrator output signal would have been selected, in which case a behavior of "undershooting" would likewise have been observed, similar to the behavior at t1 as well as similar to the behavior as depicted in FIG. 5. However, at ts, instead of selecting the integrator output signal, the selector selects the trajectory generator output signal. The trajectory generator outputs a scaled acceleration trajectory, i.e. a scaled second time derivative of the position setpoint signal, i.e. the second time derivative of the reference state signal. As a result, a delay, overshooting/undershooting, or damped ringing may be avoided, and instead a more desired trajectory may be offered by the trajectory generator. As a result, a settling time, counted from the time $t_s$, may be reduced, causing the lithographic apparatus to be ready more quickly to proceed to a following scanning movement. Consequently, a throughput of the lithographic apparatus may be improved. Generally, in any other application, a faster settling time may be achieved.

A smooth transition during change from the first control mode to the second control mode and vice versa may be achieved as follows: The trajectory generator is configured to generate in the first control mode a trajectory from a first value to a second value. Upon transition from the second control mode to the first control mode, the trajectory generator is configured to set the first value to equate the integrator output of the integrator.

Upon transition from the first control mode to the second control mode, in an embodiment, the integrator output signal is set to the second value. Thus, the integrator, when selected at the transition from the first mode to the second mode, starts at a same value as the second value of the trajectory to provide a smooth transition from the first control mode to the second control mode. In an embodiment, the second value is set to a value of the integrator output signal matching a state of the controller system when a second time derivative of the reference state signal is zero. Thus, the second value of the trajectory is set to the value which the integrator would have been reached after $t_s$, once the integrator would have stabilized after $t_s$. Accordingly, when transitioning to the second control mode, the integrator resumes at a steady state value at which it would have arrived, thus providing a stable behavior after the transition from the first control mode to the second control mode.

Alternatively, the second value may be set to zero.

In order to activate the first control mode in the case of a change in the second time derivative of the reference state signal, e.g. a change in the acceleration in case the reference state signal is a position, the feedback controller system is configured to operate in the first control mode in case an absolute value of a third time derivative of the reference state signal exceeds a predetermined threshold. Correspondingly, the feedback controller system is configured to transition from the first control mode to the second control mode in case the absolute value of the third time derivative of the reference state signal transitions below the predetermined threshold. The reference state signal may be provided to the feedback controller for the feedback controller to determine which one of the first and second control modes to select.

The feedback controller system may comprise a PD control, i.e. a proportional derivative control, a proportional derivative signal generated by the proportional derivative control being output into the feedback signal. In the second control mode, the integrator is selected and the integrator output signal being added, thus forming a PID (proportional integral derivative) feedback controller system, while in the first control mode, a PD feedback controller system is formed supplemented by the trajectory signal generated by the trajectory generator, to promote a more fast response in a dynamic situation as described above.

The controller system as described above may be comprised in a stage. The controller system may be configured to control a position of the stage. The reference state signal may be a position setpoint signal of the stage. Accordingly, the position of the stage may be controlled, whereby the controller system may transition between the second control mode and the first control mode and vice versa depending on the position setpoint signal of the stage.

The controller system may be comprised in a lithographic apparatus, such as the lithographic apparatus described with reference to FIG. 1. The controller system comprised in the lithographic apparatus may be configured to control a position of a stage of the lithographic apparatus, the reference state signal being a position setpoint of the stage.

As explained above with reference to FIG. 7, the stage may alternate between a movement at a constant velocity (e.g. for the purpose of scanning) and a movement comprising a deceleration and acceleration part, whereby the velocity of the stage is e.g. reversed in order to e.g. resume the scanning at the reverse velocity. Other movement are likewise possible. The lithographic apparatus may comprise a reference state signal generator to generate the reference state signal. The reference state signal may provide the stage to alternate between a scanning movement at a constant stage velocity and a deceleration/acceleration in which the stage changes velocity. The reference state signal may be inputted to the feedback controller system in order for the feedback controller system to determine whether to operate in the first control mode or the second control mode depending on the reference state signal. For example, the feedback controller system may alternate between the first and second control mode. For example, the feedback controller system may operate in the first control mode when an absolute value of a time derivative of the acceleration of the stage exceeds a predetermined threshold and to operate in the second control mode during the scanning movement of the stage. During the scanning movement of the stage, the velocity of the stage is for example constant or zero, thus the acceleration of the stage being zero. With zero acceleration the inclusion of the integrator in the feedback controller system may promote a high accuracy, hence a high accuracy of the positioning of the stage may be promoted. During the time periods where the acceleration of the stage changes with a certain rate over time, i.e. when the absolute value of the third derivative of the position setpoint, i.e. the third derivate of the reference state signal exceeds a certain level, the rather slow response of the integrator may adversely affect a response time of the controller system. For example, this may be the case when the third time derivative of the reference state signal, i.e. the third time derivative of the position setpoint signal, exceeds zero in absolute sense. Thus, the third time derivative of the reference state signal, i.e. the third time derivative of the position setpoint signal is smaller than or larger than zero. The fast settling as may be achieved in the first control mode may be advantageous when transitioning towards the scanning movement, i.e. the movement whereby irradiation of (parts of) the substrate takes place and whereby a high accuracy of positioning of the substrate is desired. Accordingly, the feedback controller system may operate in the first control mode when an absolute value of a time derivative of the acceleration of the stage exceeds a predetermined threshold prior to transitioning to the scanning movement of the stage.

An explanation of closed-loop stability of the above described control system is summarized below with reference to FIGS. 8-11.

In the proposed control strategy switching is performed between the plant being in closed-loop with two types of feedback controller systems, i.e. a PID and PD closed-loop scenario. Although the two closed-loop scenarios can be rendered stable by current Linear Time Invariant (LTI) frequency domain design approaches, switching between the two scenarios could in theory be unstable. To guarantee stable switching behavior in the design, the following stability analysis approach is adopted. Note that the feedback related items in the control scheme in FIG. 6 can be abstracted into the following block scheme.

Figure 8:
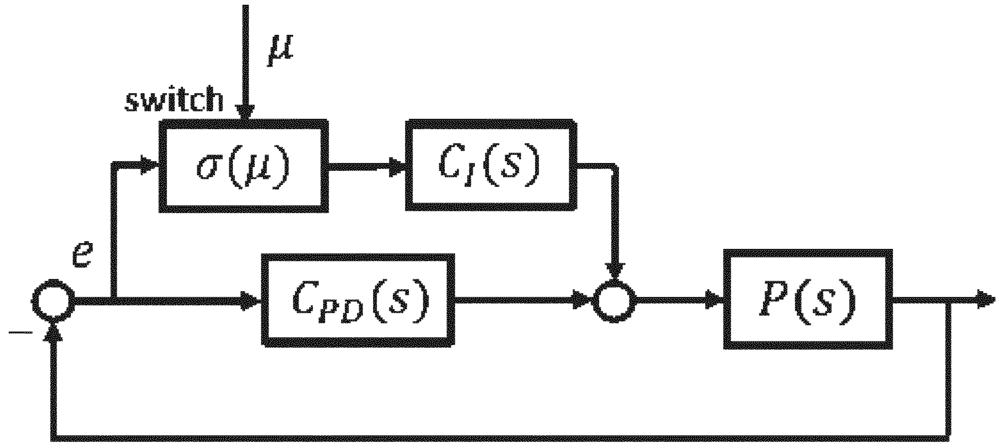
FIGS. 8 and 9 depict block diagrams based on which a switching stability of the controller system according to FIG. 6 will be explained.

FIG. 8 depicts an abstraction of the Feedback control scheme assuming arbitrary switching sequence in time.

The switch in FIG. 6 is being represented in FIG. 8 by the function $\sigma(\mu)$ where $\mu(t)$ is an exogenous signal in time taking values 0 or 1. If $\mu(t)=1$ the integrator CI(s) is in the loop. Hence, the plant P(s) is in closed-loop with a PID controller. If $\mu(t)=0$ the integrator CI(s) is out of the loop, hence the plant is in closed-loop with the PD controller.

Figure 9:
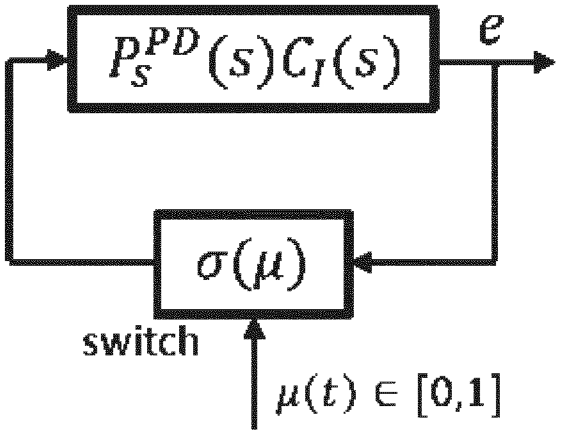
Figure 10:
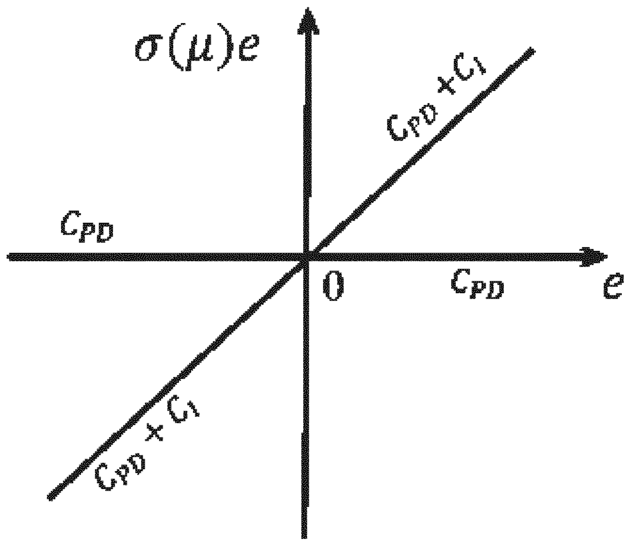
FIG. 10 depicts a Lur'e system representation based on which the switching-stability of the controller system according to FIG. 6 will be explained.

The block scheme in FIG. 8 can be represented by the Lur'e system as depicted in FIGS. 9 and 10.

With PSPD(s)=−P(s)/(P(s)CPD(s)+1) being the process sensitivity transfer corresponding to the PD control scenario.

FIG. 10: Lur'e system representation of scheme in FIG. 6. Left: $(\sigma(\mu)e, e)$-plain with domains indicating the PID and PD scenario and the sector corresponding to the switching between them.

The following Theorem can now be formulated.

Theorem 1: The Lur'e system in FIGS. 9 and 10 is globally asymptotically stable for arbitrary switching sequence $\mu(t)$ if:

1. PSPD(s) has poles in the left half side of the complex plain.
2. PSPD(0)≥0

3. $\Re\{PSPD(j\omega)CI(j\omega)\} \geq -1,\ \forall \omega \in \mathbb{R}$

The proof is in line of reasoning as applied in the proof of Theorem 1 in [Ref. 3].

To prove that the scheme in FIG. 6 is stable also under integration state reinitialization, we use the stability result in Theorem 1 on the Lur'e system depicted in FIG. 9. That is based on Theorem 1 one can conclude stability of the trajectory piece 1) PD to PID transition with CI(s) having initial condition fI,FF(ts+δt)

2) and PID to PD transition.

Naturally for the next trajectory piece, following the sequence 1 and 2 listed above, a same property holds. It holds for another arbitrary external provided initial condition value fI,FF(ts+δt) (and for PSPD having the end state value of the previous time piece as initial state condition). Now it can be concluded that a total of concatenated trajectory pieces, forming the trajectory response of the closed-loop system as indicated in FIG. 6, exhibits a globally asymptotically stability property.

Figure 11:
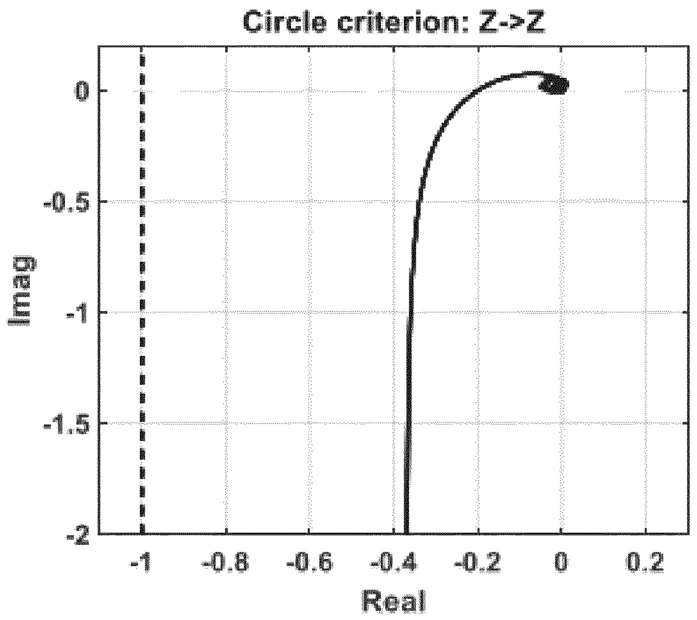
FIG. 11 depicts a complex plane based on which the switching stability of the controller system according to FIG. 6 will be explained.

It can be verified that the conditions in Theorem 1 are satisfied for the application that is considered. That is item 1 and 2 in Theorem 1 are met by using standard LTI based PD controller design. Item 3 in Theorem is a simple graphical frequency domain check. In FIG. 11 the check is performed for the application (example correspond to z-axis) that is considered. Note that item 3 from Theorem 1 is met with significant margin.

[Ref 1]: Bode's sensitivity integral—Wikipedia

[Ref 2]: On the Theory of Stability of Control Systems. Prikladnaya Matematika/Mekhanika (in Russian) Lur'e, A. I, Postnikov, V. N.

[Ref 3]: Synthesis of Variable Gain Integral Controllers for Linear Motion Systems. IEEE Transaction on Control systems technology vol. 23 No 1, January 2015, Bram Hunnekens, Nathan van de Wouw, Marcel Heertjes, Henk Nijmeijer.

Hence, the I-action with FF-mode interconnected with the PD controller and the plant is globally stable for the setpoint based triggered switching.

In another embodiment, for example in a situation wherein there is scan direction dependent disturbance force during the acceleration and/or deceleration phase of the stage, it might be beneficial that the feedback controller system is configured to operate as a function of the reference state signal in a third control mode, wherein the feedback controller system is configured to, in the third control mode, to initially set the integrator output signal generated by the integrator to zero and to select the trajectory generator output signal generated by the trajectory generator and to add the integrator output signal generated by the integrator. In this control mode the trajectory generator outputs a scaled acceleration trajectory as explained above while the integrator output compensates in addition for the scan direction dependent disturbance force.

Although specific reference may be made in this text to the use of a lithographic apparatus in the manufacture of Ics, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting.

The invention claimed is:

1. A controller system configured to control a plant, comprising:

a feedforward controller configured to provide, based on a reference state signal, a feedforward signal to the plant; and a feedback controller system configured to provide a feedback signal to the plant, based on a difference between the reference state signal and a plant state signal representing an actual state of the plant, wherein the feedback controller system comprises an integrator, a trajectory generator, and a selector configured to selectively output into the feedback signal to the plant one of a trajectory generator output signal generated by the trajectory generator and an integrator output signal generated by the integrator, wherein the feedback controller system is configured to operate as a function of the reference state signal in a first control mode or a second control mode, wherein the feedback controller system is configured to, in the first control mode, operate the selector to select the trajectory generator output signal generated by the trajectory generator, and wherein the feedback controller system is configured to, in the second control mode, operate the selector to select the integrator output signal generated by the integrator.

2. The controller system of claim 1, wherein the plant is a movable object, the reference state signal is a position setpoint of the movable object.

3. The controller system of claim 1, wherein the trajectory generator is configured to in the first control mode, generate a trajectory representative of a second time derivative of the reference state signal.

4. The controller system of claim 3, wherein the trajectory generator is configured to generate a trajectory representative of a scaled second time derivative of the reference state signal.

5. The controller system of claim 1, wherein the trajectory generator is configured to generate, in the first control mode, a trajectory from a first value to a second value, and, wherein the trajectory generator is configured to, upon transition from the second control mode to the first control mode, set the first value to equate the integrator output of the integrator.

6. The controller system of claim 5, wherein the feedback controller system is configured to, upon transition from the first control mode to the second control mode, set the integrator output signal to the second value.

7. The controller system of claim 5, wherein the second value is set to a value of the integrator output signal matching a state of the controller system when a second time derivative of the reference state signal is zero.

8. The controller system of claim 5, wherein the second value is set to zero.

9. The controller system of claim 1, wherein the feedback controller system is configured to operate in the first control mode if an absolute value of a third time derivative of the reference state signal exceeds a predetermined threshold.

10. The controller system of claim 9, wherein the feedback controller system is configured to transition from the first control mode to the second control mode if the absolute value of the third time derivative of the reference state signal transitions below the predetermined threshold.

11. The controller system of claim 1, wherein the feedback controller system further comprises a proportional derivative control, a proportional derivative signal generated by the proportional derivative control is output into the feedback signal.

12. The controller system of claim 1, wherein the feedback controller system is configured to operate as a function of the reference state signal in a third control mode, wherein the feedback controller system is configured to, in the third control mode, initially set the integrator output signal generated by the integrator to zero, and to select the trajectory generator output signal generated by the trajectory generator, and to add the integrator output signal generated by the integrator.

13. A stage comprising the controller system of claim 1, configured to control a position of the stage, the reference state signal is a position setpoint of the stage.

14. A lithographic apparatus comprising the controller system of claim 1.

15. The lithographic apparatus of claim 14, wherein the controller system is configured to control a position of a stage of the lithographic apparatus, the reference state signal is a position setpoint of the stage.

16. The lithographic apparatus of claim 15, comprising a reference state signal generator configured to generate the reference state signal, wherein the reference state signal generator is configured to generate the reference state signal to provide the stage to alternate between a scanning movement at a constant stage velocity and a deceleration/acceleration in that the stage changes velocity, the feedback controller system is configured to operate in the first control mode when an absolute value of a time derivative of the acceleration of the stage exceeds a predetermined threshold prior to transitioning to the scanning movement of the stage, and to operate in the second control mode during the scanning movement of the stage.

* * * * *